(12) United States Patent
Ono et al.

(10) Patent No.: US 10,892,191 B2
(45) Date of Patent: Jan. 12, 2021

(54) METHOD OF MANUFACTURING A SEMICONDUCTOR DEVICE

(71) Applicant: Toshiba Memory Corporation, Tokyo (JP)

(72) Inventors: Takanobu Ono, Mie (JP); Yusuke Dohmae, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/290,540

(22) Filed: Mar. 1, 2019

(65) Prior Publication Data
US 2020/0058550 A1 Feb. 20, 2020

(30) Foreign Application Priority Data
Aug. 17, 2018 (JP) ................................ 2018-153681

(51) Int. Cl.
*H01L 21/78* (2006.01)
*B23K 26/40* (2014.01)
*B23K 101/40* (2006.01)

(52) U.S. Cl.
CPC .............. *H01L 21/78* (2013.01); *B23K 26/40* (2013.01); *B23K 2101/40* (2018.08)

(58) Field of Classification Search
CPC . H01L 21/78; H01L 21/67092; H01L 21/268; H01L 21/82; B23K 26/40; B23K 26/364; B23K 26/0869; B23K 26/02; B23K 26/0853; B23K 2101/40; B23K 2101/35; B23K 2101/36
See application file for complete search history.

(56) References Cited

U.S. PATENT DOCUMENTS

| | | | | |
|---|---|---|---|---|
| 5,922,224 A * | 7/1999 | Broekroelofs | ..... | B23K 26/0608 219/121.72 |
| 7,211,526 B2 * | 5/2007 | Iri | ........................ | B28D 5/0011 438/797 |
| 7,605,344 B2 * | 10/2009 | Fukumitsu | ............. | B23K 26/03 219/121.72 |
| 7,615,721 B2 * | 11/2009 | Fukuyo | .................. | B23K 26/03 219/121.61 |
| 7,754,582 B2 | 7/2010 | Morikazu et al. | | |
| 8,389,384 B2 * | 3/2013 | Sakamoto | ............ | B28D 5/0011 438/463 |
| 8,815,705 B2 | 8/2014 | Kato | | |

(Continued)

FOREIGN PATENT DOCUMENTS

| | | |
|---|---|---|
| JP | 2003-334675 A | 11/2003 |
| JP | 2006-140356 A | 6/2006 |

(Continued)

*Primary Examiner* — Nikolay K Yushin
(74) *Attorney, Agent, or Firm* — Kim & Stewart LLP

(57) ABSTRACT

A method of manufacturing a semiconductor device, includes irradiating a division region of a semiconductor wafer with laser to form a plurality of modified portions arranged in a direction along the division region in the semiconductor wafer, and splitting the semiconductor wafer into a plurality of semiconductor chips using a groove generated from the plurality of modified portions in the semiconductor wafer. The plurality of modified portions is at a first interval in a first part of the division region and at a second interval smaller than the first interval in a second part of the division region.

23 Claims, 9 Drawing Sheets

(56) References Cited

U.S. PATENT DOCUMENTS

| | | | |
|---|---|---|---|
| 9,583,391 B2 | 2/2017 | Nakamura | |
| 2005/0199592 A1* | 9/2005 | Iri | B28D 5/0011 |
| | | | 219/121.6 |
| 2007/0170159 A1 | 7/2007 | Fukumitsu | |

FOREIGN PATENT DOCUMENTS

| | | |
|---|---|---|
| JP | 2009-184002 A | 8/2009 |
| JP | 2010-003817 A | 1/2010 |
| JP | 2014-033163 A | 2/2014 |
| JP | 2017-191625 A | 10/2017 |
| JP | 2017-191825 A | 10/2017 |
| TW | 200515966 A | 5/2005 |

\* cited by examiner

METHOD OF MANUFACTURING A SEMICONDUCTOR DEVICE

CROSS-REFERENCE TO RELATED APPLICATION

This application is based upon and claims the benefit of priority from Japanese Patent Application No. 2018-153681, filed on Aug. 17, 2018, the entire contents of which are incorporated herein by reference.

FIELD

Embodiments described herein relate generally to a method of manufacturing a semiconductor device.

BACKGROUND

A laser dicing technology is a technique in which an interior of a semiconductor wafer is modified using laser and the semiconductor wafer is split at the modified part. However, since cleavage extending from the modified part may not be straight, a material film along a dicing line of the semiconductor wafer may not be straight and so a division line may meander. In addition, after the modification by the laser, the semiconductor wafer may be thinned through a grinding process. Since the division line of the material film may further meander through the grinding process, a crack may reach a device region in a semiconductor chip.

It may be possible to increase the number of modified layers to ensure the straightness of the cleavage. However, when the number of modified layers increases, film peeling or chipping may occur in the semiconductor chip due to distortion of the modified layers or vibration caused by grinding.

DETAILED DESCRIPTION

Figure 1:
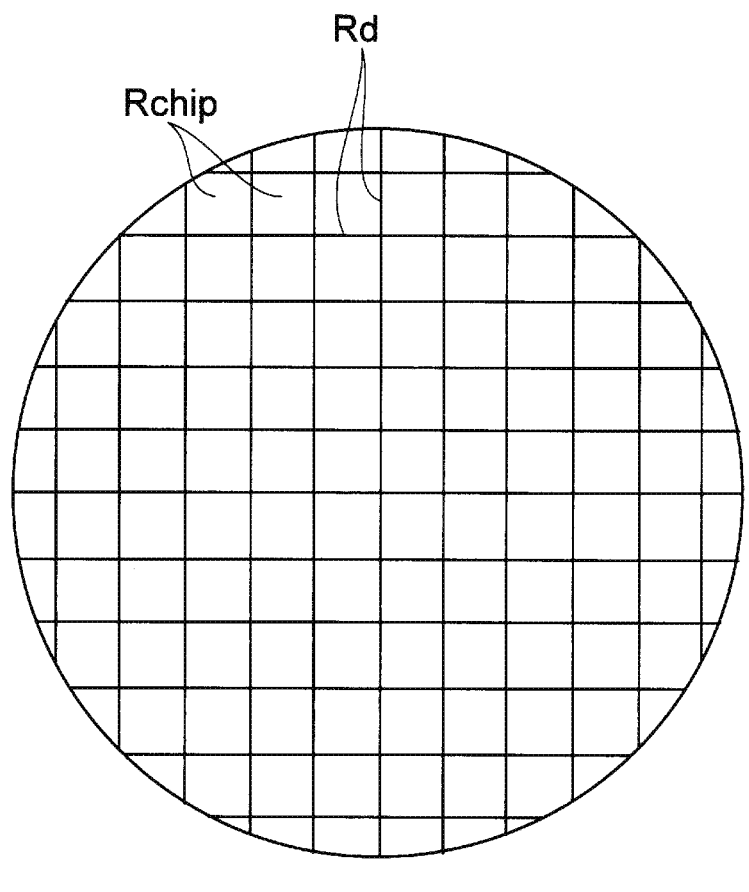
FIG. 1 illustrates a schematic plan view of an example of a semiconductor wafer according to a first embodiment.

An embodiment provides a manufacturing method of a semiconductor device directed to improving the straightness of cleavage (more generally, referred to herein as a groove) widened from a modified part while preventing film peeling or chipping of a semiconductor chip.

In general, according to an embodiment, a method of manufacturing a semiconductor device includes irradiating a division region of a semiconductor wafer with laser to form a plurality of modified portions arranged in a direction along the division region in the semiconductor wafer, and splitting the semiconductor wafer into a plurality of semiconductor chips using a groove generated from the plurality of modified portions in the semiconductor wafer. The plurality of modified portions is at a first interval in a first part of the division region and at a second interval smaller than the first interval in a second part of the division region. According to an embodiment, a method of manufacturing a semiconductor device includes irradiating a division region of a semiconductor wafer with laser to form a first plurality of modified portions arranged in a direction along the division region in the semiconductor wafer at a first depth from an irradiated surface of the semiconductor wafer, irradiating the division region of the semiconductor wafer with laser to form a second plurality of modified portions arranged in the direction along the division region in the semiconductor wafer at a second depth different from the first depth, and splitting the semiconductor wafer into a plurality of semiconductor chips using a groove generated from the first plurality of modified portions and the second plurality of modified portions in the semiconductor wafer.

Hereinafter, embodiments of the present disclosure will be described with reference to the drawings. The present embodiment does not limit the present disclosure. In the following description, a vertical direction of a semiconductor substrate indicates a relative direction when a surface provided with a semiconductor element is set as an upper side, and may be different from a vertical direction according to a gravitational acceleration. The drawings are schematic or conceptual, and proportions of components are not necessarily the same as actual ones. In the present disclosure and drawings, elements similar to those described before with reference to the drawings are denoted by the same reference numerals, and the detailed description thereof will be omitted as appropriate.

First Embodiment

FIG. 1 illustrates a schematic plan view of an example of a semiconductor wafer according to a first embodiment. A semiconductor wafer W includes a plurality of chip regions Rchip and a plurality of dicing regions Rd. The chip regions Rchip and the dicing regions Rd are regions on a surface of the semiconductor wafer W.

In the chip region Rchip as a semiconductor chip region, semiconductor elements (not illustrated) such as a transistor and a memory cell array are provided. The semiconductor elements are formed on the semiconductor wafer W through a semiconductor manufacturing process. The semiconductor element, for example, may be a memory cell array of a NAND type flash memory or a control circuit thereof. The memory cell array, for example, may be a three-dimensional memory cell array in which memory cells are three-dimensionally arranged. Of course, the present embodiment may also be applied to large scale integration (LSI) in addition to the semiconductor memory.

The dicing region Rd as a division region is a line-shaped region between adjacent chip regions Rchip and is a region to be cut by dicing. The dicing region Rd is also called a dicing line. According to the present embodiment, a substrate 10 is irradiated with laser, so that a modified part is formed in the substrate 10 of the dicing region Rd and the semiconductor wafer W is cleaved by using the modified part as a starting point. In this way, the semiconductor wafer W is segmented per each chip region Rchip and becomes semiconductor chips. It is noted that silicon is exemplified as a semiconductor, but semiconductors other than silicon may be used.

Next, a dicing method of the semiconductor wafer W will be described. In the present embodiment, the semiconductor wafer W is cut by a laser dicing method using laser light. As the laser light, for example, transmission laser of an infrared region is used.

FIGS. 2 to 8 illustrate an example of a dicing method according to the first embodiment. A semiconductor element formed on the semiconductor wafer W is simplified and illustrated as an element forming layer 20.

Figure 2:
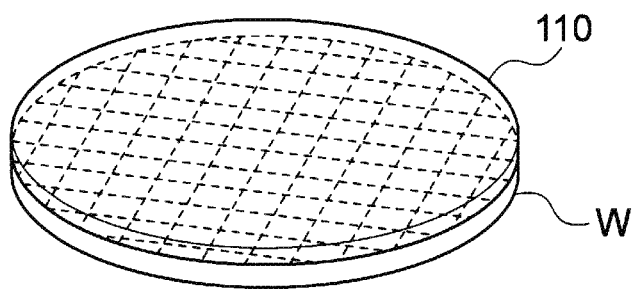
FIG. 2 illustrates a view of the semiconductor wafer to illustrate an example of a dicing method according to the first embodiment.

First, as illustrated in FIG. 2, a protection tape 110 for dicing is adhered to the surface of the semiconductor wafer W. The protection tape 110 is attached on the element forming layer 20 of the semiconductor wafer W to protect the element forming layer 20 while laser dicing.

Figure 3:
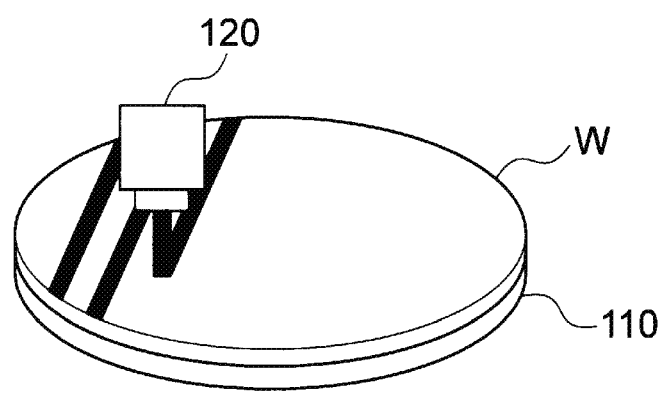
FIGS. 3-5 illustrate an example of a process of the dicing method.
Figure 4:
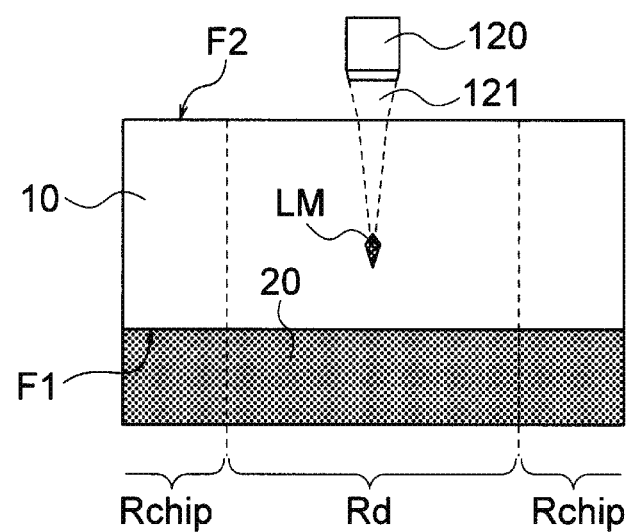

Next, the semiconductor wafer W and the protection tape 110 are vertically inverted, and then a part corresponding to the dicing region Rd is irradiated with laser light 121 from a rear surface of the semiconductor wafer W using a laser oscillator 120 as illustrated in FIGS. 3 and 4. In this way, as illustrated in FIG. 4, a modified part LM is formed in the semiconductor wafer W. The modified part LM is formed in the substrate 10 in the dicing region Rd.

Figure 5:
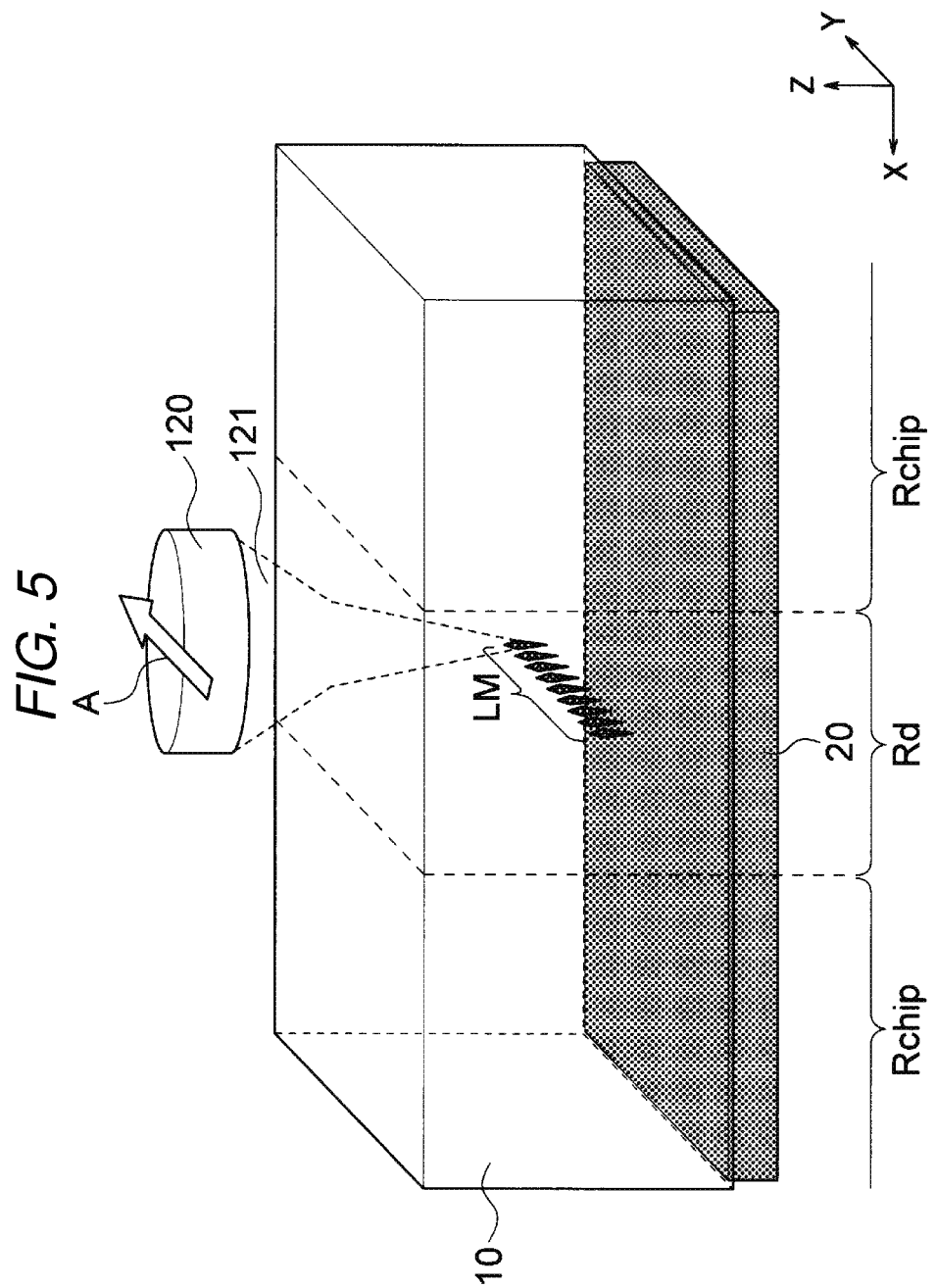

FIG. 5 is a perspective view illustrating a state at the time of irradiation with the laser light 121. The laser oscillator 120 irradiates the laser light 121 in the form of pulses while moving in a Y direction as indicated by an arrow A. In this way, the modified part LM is intermittently formed in the Y direction and is formed approximately in parallel along the dicing region Rd. Such modified parts LM are intermittently formed, but are connected in the Y direction and have an approximately layered shape. The modified part LM may be a single layer, but may be a plurality of layers formed at different positions (heights) in a Z direction. The formation method of the modified part LM using the laser light will be described later with reference to FIG. 9 and the subsequent drawings.

Figure 6:
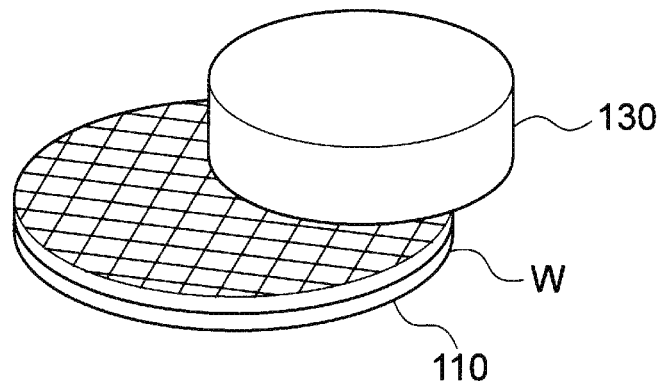
FIGS. 6-7 illustrate an example of a process of the dicing method subsequent to the process illustrated in FIG. 3.
Figure 7:
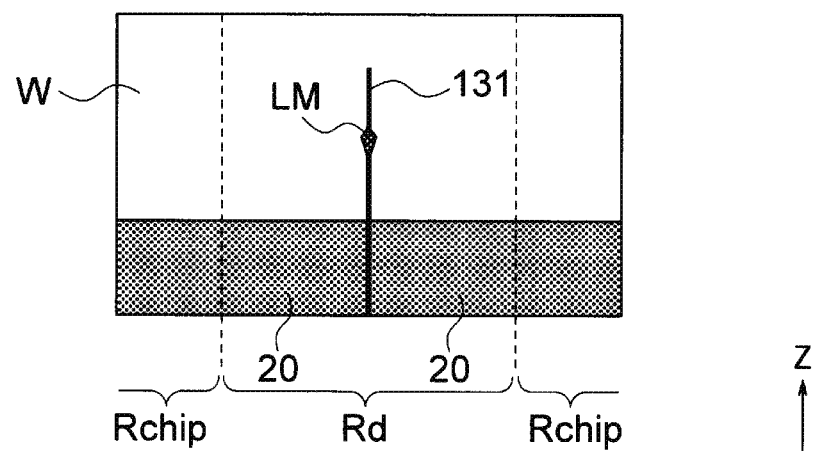

Next, as illustrated in FIG. 6, the rear surface of the semiconductor wafer W is grounded and/or polished. The rear surface of the semiconductor wafer W is polished by a grindstone 130, so that the semiconductor wafer W is thinned and a cleavage 131 is widened from the modified part LM in the Z direction due to vibration of the polishing as illustrated in FIG. 7. The semiconductor wafer W is polished until the modified part LM is removed.

Figure 8:
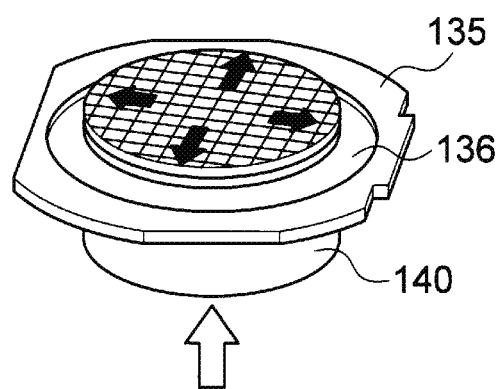
FIG. 8 illustrates an example of a process of the dicing method subsequent to the process illustrated in FIG. 6.

Next, the rear surface of the semiconductor wafer W is adhered on a dicing tape 136 including an adhesive layer, and the dicing tape 136 is fixed with a ring 135. Next, as illustrated in FIG. 8, the dicing tape 136 is pushed up from below by a pushing-up member 140, so that the dicing tape 136 is pulled (expanded). In this way, the semiconductor wafer W is pulled outward together with the dicing tape 136. In such a case, the semiconductor wafer W is further cleaved along the modified part LM (that is, along the dicing line) by using the modified part LM as the starting point, so that the semiconductor wafer W is segmented into a plurality of semiconductor chips.

It is noted that, in the above example, the rear surface of the semiconductor wafer W is polished after the laser irradiation. However, the laser irradiation may be performed after the rear surface of the semiconductor wafer W is polished.

Thereafter, the semiconductor chips are respectively picked up and are mounted on a resin substrate (not illustrated). The semiconductor chips are bonded to the resin substrate by a metal wire and are sealed with resin. In this way, a semiconductor package is completed.

Next, the formation method of the modified part LM using laser light will be described.

Figure 9:
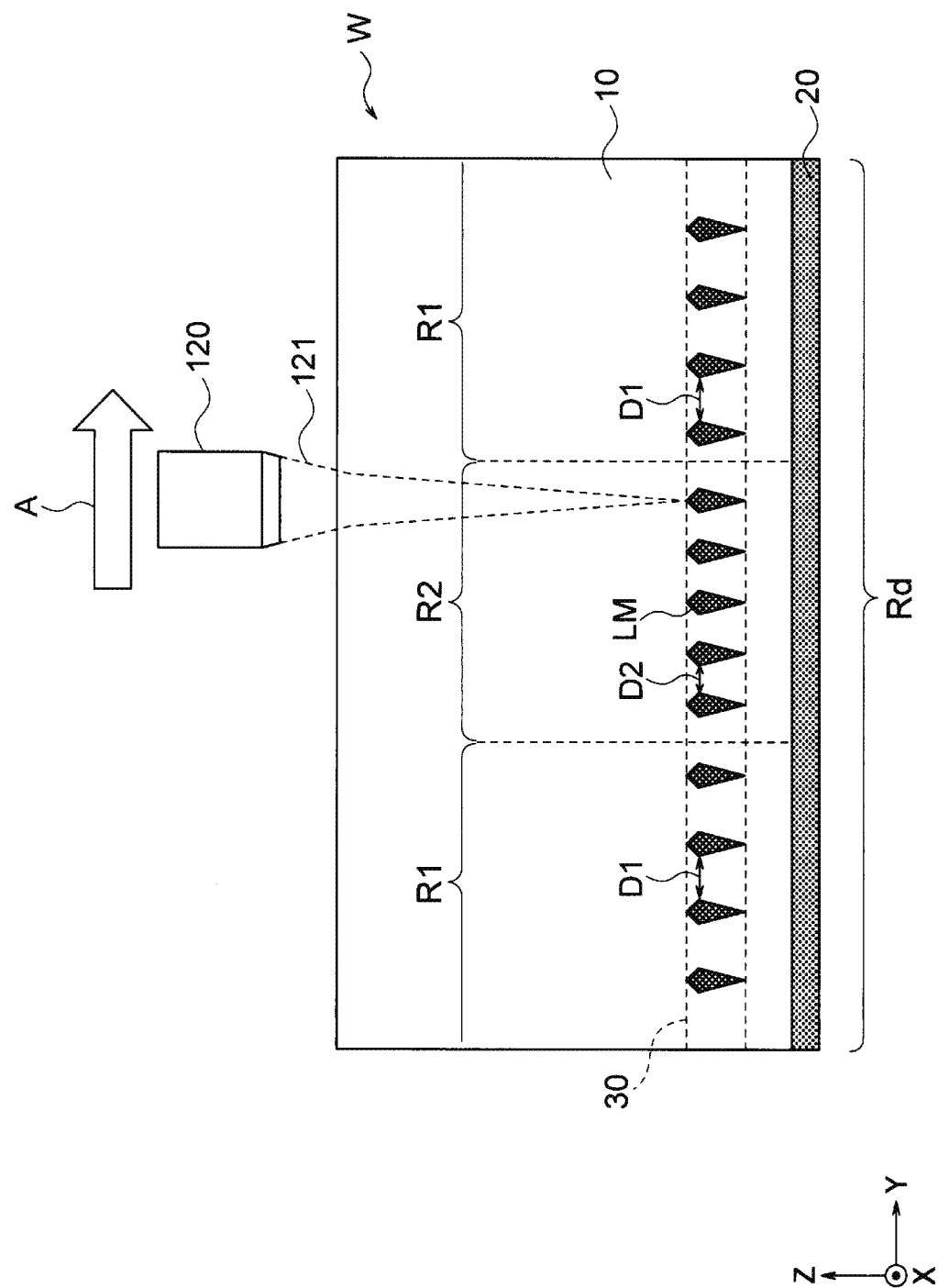
FIG. 9 illustrates a cross-sectional view of a semiconductor wafer during laser irradiation according to the first embodiment.

FIG. 9 illustrates a cross-sectional view of a semiconductor wafer to illustrate during the laser irradiation according to the first embodiment. The laser oscillator 120 irradiates the dicing region Rd of the substrate 10 with the laser light 121. In FIG. 9, the laser oscillator 120 periodically oscillates the laser light 121 in the form of pulses while moving in the direction indicated by the arrow A (the Y direction) relatively to the semiconductor wafer W. In this way, a plurality of modified parts LM is formed so as to be arranged in the substrate 10 in a row along the dicing region Rd. That is, in the first embodiment, the plurality of modified parts LM are arranged at approximately the same height in a thickness direction of the semiconductor wafer W and are formed as a single modified layer 30. In an embodiment, the plurality of modified parts LM of the modified layer 30 depicted in FIG. 9 may be referred to as a plurality of modified portions.

The modified parts LM are formed with a first interval D1 in a first part R1 of the dicing region Rd, and are formed with a second interval D2 narrower than the first interval D1 in a second part R2. For example, the laser oscillator 120 oscillates the laser light 121 in the form of pulses at a first period while moving at a first speed in the first part R1 relatively to the semiconductor wafer W. In this way, in the first part R1, the modified parts LM are formed with first intervals D1. Furthermore, the laser oscillator 120 oscillates the laser light 121 in the form of pulses at the first period while moving at a second speed slower than the first speed in the second part R2 relatively to the semiconductor wafer W. In this way, in the second part R2, the modified parts LM are formed with second intervals D2. Alternatively, the laser oscillator 120 oscillates the laser light 121 in the form of pulses at the first period while moving at the first speed in the first part R1 relatively to the semiconductor wafer W. In this way, in the first part R1, the modified parts LM are formed with first intervals D1. Furthermore, the laser oscillator 120 oscillates the laser light 121 in the form of pulses at a second period shorter than the first period while moving at the first speed in the second part R2 relatively to the semiconductor wafer W. In this way, in the second part R2, the modified parts LM are formed with second intervals D2. As described above, the intervals of the modified parts LM in the first part R1 and the second part R2 may be controlled by changing the relative speed of the laser oscillator 120 to the semiconductor wafer W, or the intervals of the modified parts LM in the first part R1 and the second part R2 may be controlled by changing the oscillation frequency of the laser light in the laser oscillator 120.

When an interval between adjacent modified parts LM is relatively wide, the straightness of cleavage of the semiconductor wafer W is reduced, but the strength of the semiconductor wafer W is maintained. Accordingly, when the rear surface of the semiconductor wafer W is polished, film peeling or chipping of the semiconductor chip due to vibration is prevented. Furthermore, since the number of the modified parts LM (the number of times of oscillation of the laser light) is small, the formation time of the modified parts LM is shortened. On the other hand, when the interval between the adjacent modified parts LM is relatively narrow, the strength of the semiconductor wafer W is weak, but the straightness of cleavage widened from the modified parts LM is improved. Accordingly, when the rear surface of the semiconductor wafer W is polished, the division line of the semiconductor chip meanders less and extends in an approximately straight line shape. Thus, in a place where film peeling or chipping occurs, it is sufficient if the interval between the modified parts LM is made wider, and in a place where the cleavage meanders, it is sufficient if the interval between the modified parts LM is made narrower.

For example, when film peeling or chipping occurs at an intermediate part of a side of the semiconductor chip of the semiconductor wafer W, it is sufficient if the modified parts LM are formed with the first interval D1 at the intermediate part of the side of the semiconductor chip as with the first part R1. On the other hand, when the division line meanders at a corner part of the semiconductor chip of the semiconductor wafer W, it is sufficient if the modified parts LM are formed with the second interval D2 as with the second part R2. In contrast, when the division line meanders at the intermediate part of the side of the semiconductor chip, it is sufficient if the modified parts LM are formed with the second interval D2 at the intermediate part of the side of the semiconductor chip as with the second part R2. When the film peeling or chipping occurs at the corner part of the semiconductor chip of the semiconductor wafer W, it is sufficient if the modified parts LM are formed with the first interval D1 at the corner part of the semiconductor chip as with the first part R1.

In this way, when the rear surface of the semiconductor wafer W is polished or when the semiconductor wafer W is expanded on a dicing tape, it is possible to improve the straightness of cleavage widened from the modified parts LM while preventing film peeling or chipping at the entire outer edge of each semiconductor chip.

Second Embodiment

Figure 10:
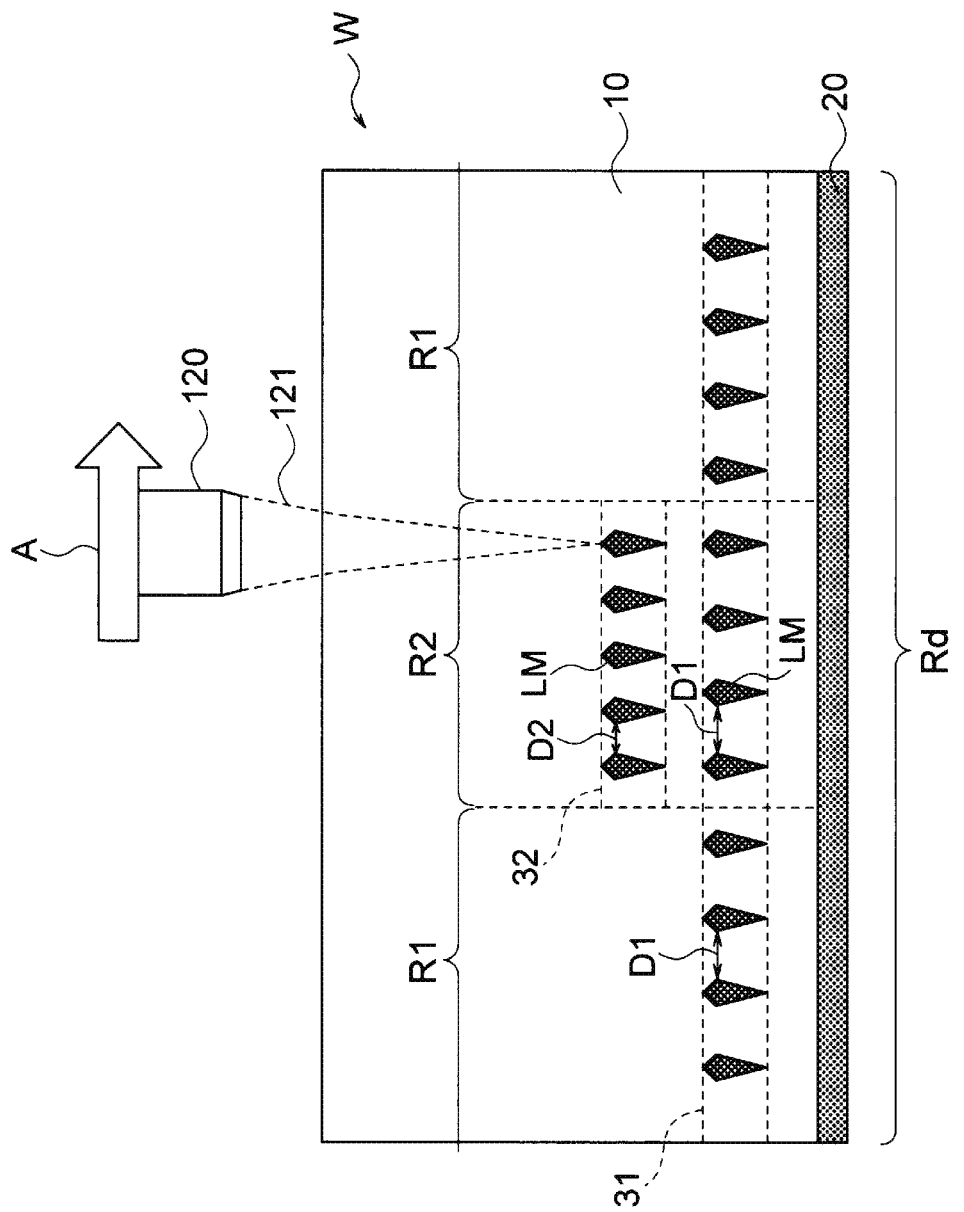
FIG. 10 illustrates a cross-sectional view of a semiconductor wafer during laser irradiation according to a second embodiment.

FIG. 10 illustrates a cross-sectional view of a semiconductor wafer during laser irradiation according to a second embodiment.

In the first embodiment, the interval (a pitch) between the modified parts LM in the single modified layer 30 is changed.

In contrast, in the second embodiment, the modified parts LM constitute a plurality of modified layers 31 and 32 and an interval between the modified parts LM is changed between the modified layer 31 and the modified layer 32. The modified layers 31 and 32 are arranged at a plurality of rows at different positions in the thickness direction (the Z direction) of the semiconductor wafer W. In an embodiment, the modified parts LM in the modified layer 31 depicted in FIG. 10 may be referred to as a first plurality of modified portions, and the modified parts LM in the modified layer 32 depicted in FIG. 10 may be referred to as a second plurality of modified portions.

For example, first, the first modified layer 31 is formed as a first row of the plurality of rows. In the formation of the first modified layer 31, the laser oscillator 120 irradiates the substrate 10 with the laser light 121 at first intervals D1. In this way, a plurality of modified parts LM is formed in the substrate 10 with first intervals D1, so that the first modified layer 31 is formed. The first modified layer 31 is formed relatively near the element forming layer 20 of the surface of the semiconductor wafer W. When viewed from the rear surface of the semiconductor wafer W, the first modified layer 31 is formed at a relatively deep position. Furthermore, the first modified layer 31 is formed in the entire dicing region Rd along the dicing region Rd. That is, the first modified layer 31 is formed all around each semiconductor chip.

Next, the second modified layer 32 is formed as a second row. The plurality of modified parts LM is formed in the substrate 10 with second intervals D2, so that the second modified layer 32 is formed. In such a case, the laser oscillator 120 moves the intensity peak of the laser light 121 to a position shallower than the first modified layer 31 and irradiates the substrate 10 with the laser light 121 at second intervals D2. That is, the intensity peak of the laser light is shallower in the Z direction than that at the time of formation of the first modified layer 31. In this way, when viewed from the rear surface of the semiconductor wafer W, the second modified layer 32 is formed at a position shallower than that of the first modified layer 31. That is, the second modified layer 32 is formed at a position relatively farther from the element forming layer 20 than the first modified layer 31. Furthermore, the second modified layer 32 is partially formed along the dicing region Rd. The second modified layer 32 is partially formed around each semiconductor chip. Other processes of the second embodiment may be similar to corresponding processes of the first embodiment. It is noted that it is sufficient if the semiconductor wafer W is polished until the second modified layer 32 or both the first and second modified layers 31 and 32 are removed.

Basically, the first and second modified layers 31 and 32 are formed similarly to the modified layer 30 of the first embodiment. However, as described above, the first and second modified layers 31 and 32 differ from each other in intervals between the modified parts LM and positions of the modified parts LM in the Z direction.

As described above, when intervals between adjacent modified parts LM are relatively wide, the straightness of cleavage of the semiconductor wafer W is reduced, but the strength of the semiconductor wafer W is maintained. Accordingly, when the rear surface of the semiconductor wafer W is polished, film peeling or chipping of a semiconductor chip due to vibration is prevented. Furthermore, the formation time of the modified parts LM is shortened. On the other hand, when the intervals between adjacent modified parts LM are relatively narrow, the strength of the semiconductor wafer W is weak, but the straightness of cleavage widened from the modified parts LM is improved. Accordingly, when the rear surface of the semiconductor wafer W is polished, the division line of the semiconductor chip meanders less and extends in an approximately straight line shape. Moreover, when a plurality of rows of modified layers are provided at different positions in the thickness direction (the Z direction) of the semiconductor wafer W, the strength of the semiconductor wafer W is weak, but the straightness of cleavage of the semiconductor wafer W is further improved. Accordingly, when the rear surface of the semiconductor wafer W is polished, the division line of the semiconductor chip meanders less and extends in an approximately straight line shape.

In this regard, in the second embodiment, in a place where film peeling or chipping occurs, intervals between the modified parts LM are made wider and the number of modified layers is decreased. On the other hand, in a place where the cleavage meanders, the intervals between the modified parts LM are made narrower and the number of modified layers is increased. For example, when the film peeling or chipping occurs at an intermediate part of a side of the semiconductor chip of the semiconductor wafer W, the modified parts LM are formed with the first interval D1 at the intermediate part of the side of the semiconductor chip as with the first part R1, so that the single modified layer 31 is formed. In the first part R1, the second modified layer 32 is not provided. On the other hand, when the division line meanders at a corner part of the semiconductor chip of the semiconductor wafer W, the modified parts LM are formed as the plurality of modified layers 31 and 32 as with the second part R2. In the second modified layer 32, the modified parts LM are formed with the second interval D2 narrower than the first interval D1. In contrast, when the division line meanders at the intermediate part of the side of the semiconductor chip, the modified parts LM are formed as a plurality of modified layers (the first and second modified layers 31 and 32) as with the second part R2 and are formed with the second interval D2 in the second modified layer 32. When the film peeling or chipping occurs at the corner part of the semiconductor chip of the semiconductor wafer W, the modified parts LM are formed with the first interval D1 as with the first part R1, so that the single modified layer 31 is formed. In the first part R1, the second modified layer 32 is not provided.

In this way, when the rear surface of the semiconductor wafer W is polished or when the semiconductor wafer W is expanded on a dicing tape, it is possible to improve the straightness of cleavage widened from the modified parts LM while preventing film peeling or chipping at the entire outer edge of each semiconductor chip.

Third Embodiment

Figure 11:
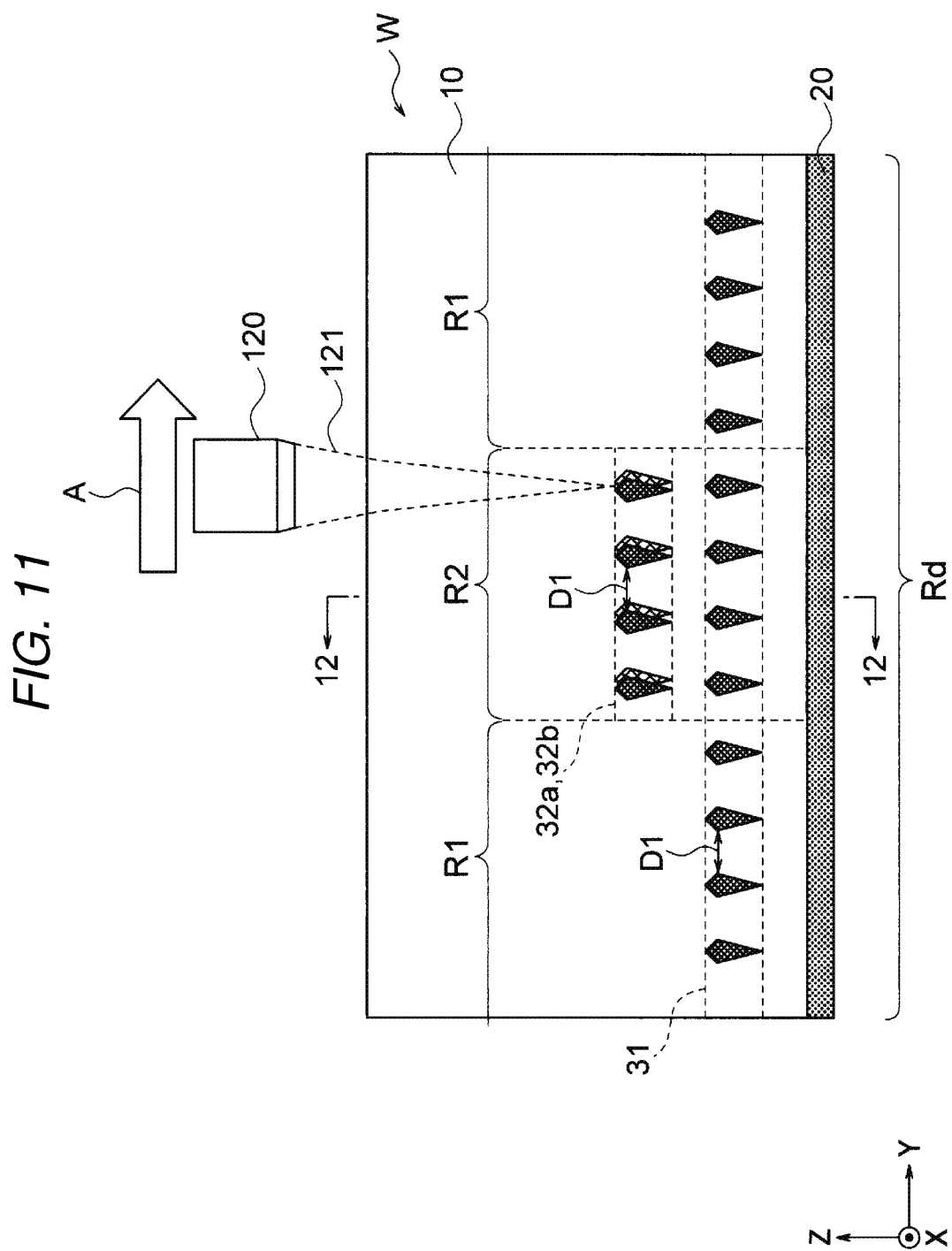
FIG. 11 illustrates a cross-sectional view of a semiconductor wafer during laser irradiation according to a third embodiment.
Figure 12:
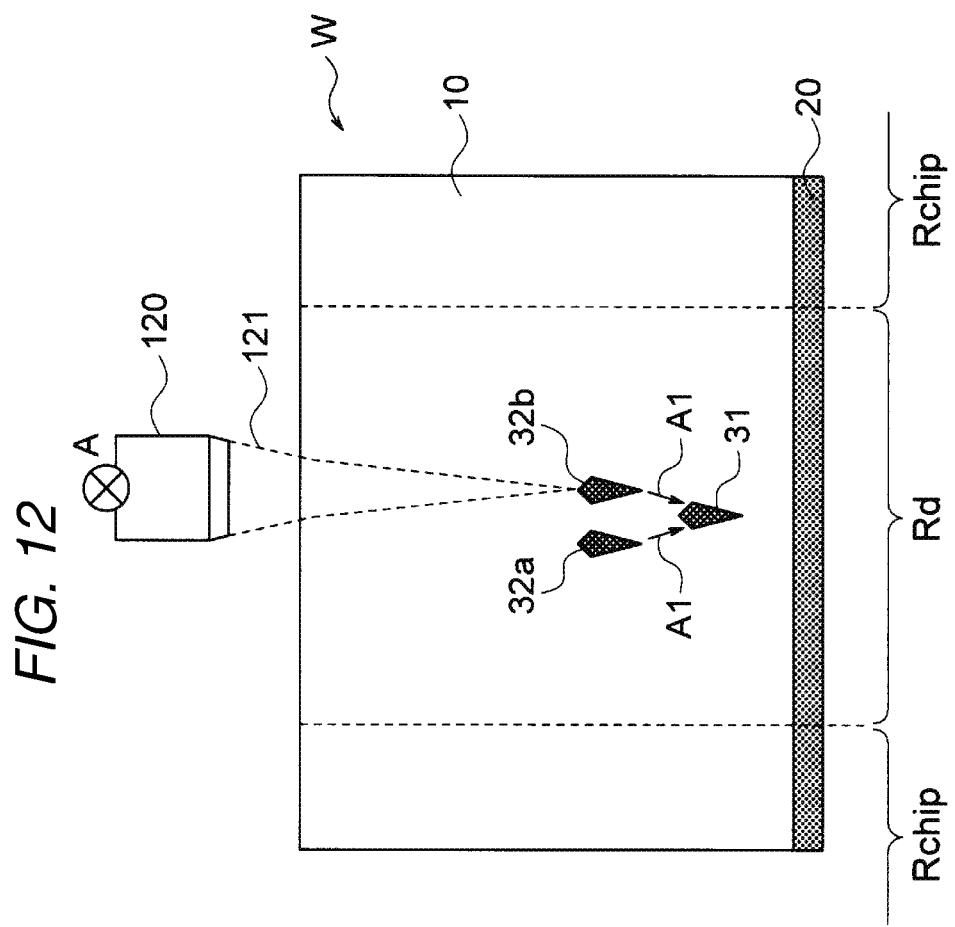
FIG. 12 illustrates another cross-sectional view of the semiconductor wafer during the laser irradiation according to the third embodiment.

FIGS. 11 and 12 illustrate cross-sectional views of a semiconductor wafer during laser irradiation according to a third embodiment. FIG. 12 illustrates a sectional view taken along line 12-12 of FIG. 11.

In the second embodiment, each of the first and second modified layers 31 and 32 arranged at a plurality of rows at different positions in the Z direction is a single layer.

In contrast, according to the third embodiment, the second modified layer 32 are arranged at a plurality of rows at different positions in a direction (a X direction) approximately perpendicular to the thickness direction (the Z direction) of the semiconductor wafer W and the arrangement direction (the Y direction) of the modified parts LM. In the plurality of rows of the second modified layer 32, one row is referred to as 32a and the other row is referred to as 32b. That is, second modified layers 32a and 32b are arranged in parallel to each other in the X direction. In an embodiment, modified parts in the modified layer 31 depicted in FIGS. 11 and 12 may be referred to as a first plurality of modified portions, modified parts in the row of the second modified layer 32a depicted in FIG. 11 may be referred to as a second plurality of modified portions, and modified parts in the row of the second modified layer 32b depicted in FIGS. 11 and 12 may be referred to as a third plurality of modified portions.

For example, first, the first modified layer 31 is formed similarly to the second embodiment.

Next, the second modified layer 32a is formed. The laser oscillator 120 sets the intensity peak of the laser light 121 to a position shallower in the Z direction than the first modified layer 31 and shifted to the −X direction from directly above the first modified layer 31. In this way, as illustrated in FIG. 12, the second modified layer 32a is formed at a position shallower in the Z direction than the first modified layer 31 and shifted to the −X direction. Furthermore, the second modified layer 32a is partially (R2) formed in the dicing region Rd along the periphery of each semiconductor chip. In the second modified layer 32a, intervals between the modified parts LM may be the first interval D1.

Next, the second modified layer 32b is formed. The laser oscillator 120 sets the intensity peak of the laser light 121 to a height approximately the same as that of the second modified layer 32a in the Z direction and to a position shifted to the +X direction. In this way, as illustrated in FIG. 12, the second modified layer 32b is formed at a position shallower in the Z direction than the first modified layer 31 and shifted to the +X direction. Furthermore, the second modified layer 32b is partially (R2) formed in the periphery of each semiconductor chip along the dicing region Rd. In the second modified layer 32b, intervals between the modified parts LM may be the first interval D1. Other processes of the third embodiment may be similar to corresponding processes of the second embodiment. It is noted that it is sufficient if the semiconductor wafer W is polished until the second modified layers 32a and 32b or all the first and second modified layers 31, 32a, and 32b are removed.

As described above, the second modified layers 32a and 32b are respectively formed at positions shifted to the ±X direction from directly above the first modified layer 31. The second modified layers 32a and 32b are not directly above the first modified layer 31, but are formed above the first modified layer 31. In this way, the straightness of cleavage of the semiconductor wafer W is improved.

Furthermore, when the cleavage is propagated from the second modified layers 32a and 32b, the cleavage is concentrated to the first modified layer 31 as indicated by arrows A1. Accordingly, the plurality of second modified layers 32a and 32b are formed, so that the cleavage propagated from a wide range can be concentrated to the first modified layer 31 which is a single layer.

Moreover, when the rear surface of the semiconductor wafer W is polished, pressure from the grindstone is applied from the Z direction. On the other hand, the plurality of second modified layers 32a and 32b are provided, so that distortion in the longitudinal direction is dispersed. Thus, vibration resistance of the semiconductor wafer W in a polishing process is improved.

It is noted that the third embodiment may be combined with the first embodiment. That is, in the second part R2, intervals between the modified parts LM may be D2.

Fourth Embodiment

Figure 13:
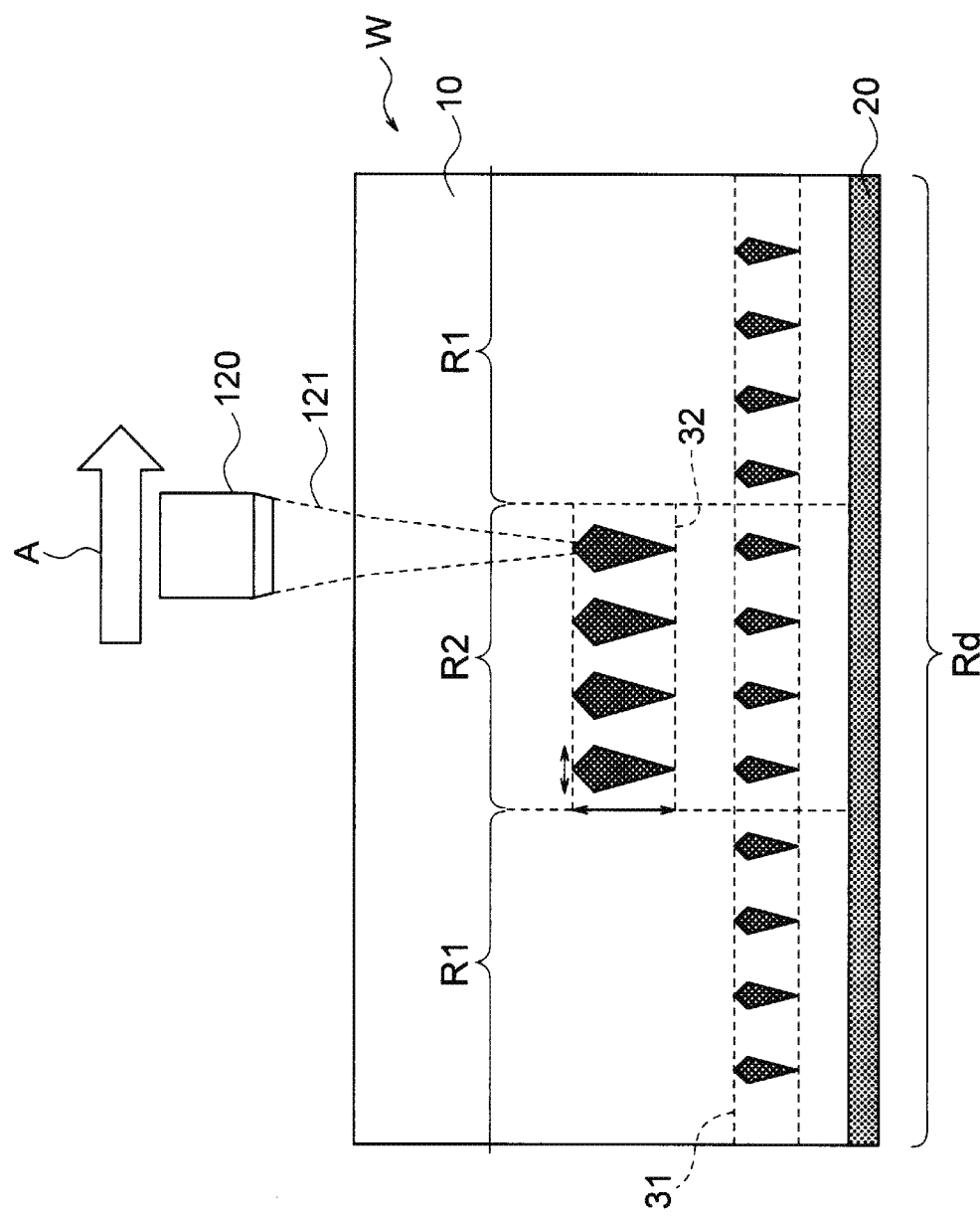
FIG. 13 illustrates a cross-sectional view of the semiconductor wafer during laser irradiation according to a fourth embodiment.

FIG. 13 illustrates a cross-sectional view of a semiconductor wafer during laser irradiation according to a fourth embodiment. According to the fourth embodiment, the size of the second modified layer 32 is larger than that of the second embodiment. For example, in the formation of the second modified layer 32, the laser oscillator 120 sets the output energy (the output intensity) of the laser light 121 to be higher than that of the laser light 121 used in the formation of the first modified layer 31. In this way, the size of the modified parts LM of the second modified layer 32 is larger than that of the modified parts LM of the first modified layer 31. Intervals between the modified parts LM in the second modified layer 32 may be the first interval D1. Other processes of the fourth embodiment may be similar to corresponding processes of the second embodiment. It is noted that it is sufficient if the semiconductor wafer W is polished until the second modified layer 32 or both the first and second modified layers 31 and 32 are removed. In an embodiment, modified parts in the modified layer 31 depicted in FIG. 13 may be referred to as a first plurality of modified portions, and modified parts in the modified layer 32 depicted in FIG. 13 may be referred to as a second plurality of modified portions.

As described above, the modified parts LM of the second modified layer 32 are made larger than that of the first modified layer 31, so that the straightness of cleavage of the semiconductor wafer W is improved. On the other hand, since the output of the laser light at the time of formation of the second modified layer 32 is increased, the strength of the semiconductor wafer W due to vibration may be weak. Accordingly, it is preferable that the second modified layer 32 is formed at a position far from the surface of the semiconductor wafer W in the Z direction. It is preferable that the second modified layer 32 is formed at a place where the straightness of cleavage of the semiconductor wafer W is obtained. In addition, the fourth embodiment can also obtain the effects of the second embodiment.

In the above embodiments, the number of modified layers is not limited to 2 and may be 3 or more. Furthermore, the first modified layer 31 is provided closer to the surface of the semiconductor wafer W than the second modified layer 32. However, the second modified layer 32 may be provided closer to the surface of the semiconductor wafer W than the first modified layer 31.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    irradiating a division region of a semiconductor wafer with laser to form a plurality of modified portions arranged in a direction along a top surface of the semiconductor wafer and along the division region in the semiconductor wafer, the plurality of modified portions being at a first interval in a first part of the division region and at a second interval smaller than the first interval in a second part of the division region; and
    splitting the semiconductor wafer into a plurality of semiconductor chips using a cleavage generated from the plurality of modified portions in the semiconductor wafer,
    wherein, in a sub region of the division region that corresponds to one of the plurality of semiconductor chips, modified portions at the second interval are formed at edge areas of the one of the plurality of semiconductor chips in the direction, and not formed at an intermediate area between the edge areas, and modified portions at the first interval are formed at the intermediate area and not formed at the edge areas.

2. The method of claim 1, wherein the second part of the division region is closer to an edge of the semiconductor wafer than the first part of the division region.

3. The method of claim 1, wherein the first part of the division region is closer to an edge of the semiconductor wafer than the second part of the division region.

4. The method of claim 1, wherein the irradiating the division region of the semiconductor wafer with the laser comprises:
    moving a laser source relative to the semiconductor wafer along a surface of the semiconductor wafer at a first speed when irradiating the first part of the division region with the laser; and
    moving the laser source relative to the semiconductor wafer along the surface of the semiconductor wafer at a second speed slower than the first speed when irradiating the second part of the division region with the laser.

5. The method of claim 1, wherein the irradiating the division region of the semiconductor wafer with the laser comprises:
    generating pulses of the laser at a first frequency when irradiating the first part of the division region with the laser; and
    generating pulses of the laser at a second frequency greater than the first frequency when irradiating the second part of the division region with the laser.

6. A method of manufacturing a semiconductor device, comprising:
    irradiating a division region of a semiconductor wafer with laser to form a first plurality of modified portions arranged in a direction along a top surface of the semiconductor wafer and along the division region in the semiconductor wafer at a first depth from an irradiated surface of the semiconductor wafer;
    irradiating the division region of the semiconductor wafer with laser to form a second plurality of modified portions arranged in the direction at a second depth different from the first depth; and
    splitting the semiconductor wafer into a plurality of semiconductor chips using a cleavage generated from the first plurality of modified portions and the second plurality of modified portions in the semiconductor wafer,
    wherein, in a sub region of the division region that corresponds to one of the plurality of semiconductor chips, the second plurality of modified portions is formed at edge areas of the one of the plurality of semiconductor chips in the direction and not formed at an intermediate area between the edge areas, and the first plurality of modified portion is formed at the edge areas and the intermediate area.

7. The method of claim 6, further comprising:
    irradiating the division region of the semiconductor wafer with laser to form a third plurality of modified portions arranged in the direction along the division region in the semiconductor wafer at the second depth, wherein the cleavage is generated also from the third plurality of modified portions.

8. The method of claim 7, wherein the first plurality of modified portions is formed at a first interval, and the second plurality of modified portions and the third plurality of modified portions are formed at a second interval smaller than the first interval.

9. The method of claim 7, wherein the first depth is greater than the second depth.

10. The method of claim 6, wherein a size of each of the second plurality of modified portions is greater than a size of each of the first plurality of modified portions.

11. The method of claim 10, wherein
    the irradiating the division region of the semiconductor wafer with the laser to form the first plurality of modified portions comprises irradiating the division region of the semiconductor wafer with laser at a first output energy;

the irradiating the division region of the semiconductor wafer with the laser to form the second plurality of modified portions comprises irradiating the division region of the semiconductor wafer with laser at a second output energy greater than the first output energy.

12. The method of claim 10, wherein the first depth is greater than the second depth.

13. The method of claim 6, wherein the first plurality of modified portions is formed at a first interval, and the second plurality of modified portions is formed at a second interval smaller than the first interval.

14. The method of claim 13, wherein the first depth is greater than the second depth.

15. The method of claim 13, wherein
the irradiating the division region of the semiconductor wafer with the laser to form the first plurality of modified portions comprises moving a laser source relative to the semiconductor wafer along a surface of the semiconductor wafer at a first speed, and
the irradiating the division region of the semiconductor wafer with the laser to form the second plurality of modified portions comprises moving the laser source relative to the semiconductor wafer along a surface of the semiconductor wafer at a second speed slower than the first speed.

16. The method of claim 13, wherein
the irradiating the division region of the semiconductor wafer with the laser to form the first plurality of modified portions comprises generating pulses of the laser at a first frequency, and
the irradiating the division region of the semiconductor wafer with the laser to form the second plurality of modified portions comprises generating pulses of the laser at a second frequency greater than the first frequency.

17. The method of claim 13, wherein
the first plurality of modified portions is formed in a first part of the division region and in a second part of the division region, and
the second plurality of modified portions is formed in the second part of the division region and not in the first part of the division region.

18. The method of claim 17, wherein the first part of the division region is closer to an edge of the semiconductor wafer than the second part of the division region.

19. A method of manufacturing a semiconductor device, comprising:
irradiating a division region of a semiconductor wafer with laser at a first output energy to form a first plurality of modified portions arranged in a direction along the division region in the semiconductor wafer at a first depth from an irradiated surface of the semiconductor wafer;
irradiating the division region of the semiconductor wafer with laser at a second output energy greater than the first output energy to form a second plurality of modified portions arranged in the direction along the division region in the semiconductor wafer at a second depth different from the first depth, a size of each of the second plurality of modified portions being greater than a size of each of the first plurality of modified portions; and
splitting the semiconductor wafer into a plurality of semiconductor chips using a cleavage generated from the first plurality of modified portions and the second plurality of modified portions in the semiconductor wafer.

20. The method of claim 19, wherein the first depth is greater than the second depth.

21. The method of claim 19, wherein a size of each of the second plurality of modified portions in the direction along the division region is greater than a size of each of the first plurality of modified portions in the direction along the division region.

22. The method of claim 19, wherein the irradiating with the laser at the second output energy is carried out after the irradiating with the laser at the first output energy.

23. The method of claim 19, wherein, in a sub region of the division region that corresponds to one of the plurality of semiconductor chips, the second plurality of modified portions is formed at edge areas of the one of the plurality of semiconductor chips in the direction and not formed at an intermediate area between the edge areas, and the first plurality of modified portion is formed at the edge areas and the intermediate area.

* * * * *